(12) United States Patent
Oh et al.

(10) Patent No.: US 10,545,332 B2
(45) Date of Patent: Jan. 28, 2020

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Hwa Jin Oh, Seoul (KR); Hun Kyo Kim, Cheonan-si (KR); Hyoung Suk Roh, Cheonan-si (KR); Dong Jin Seo, Seoul (KR); Kwan Young Han, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/275,164

(22) Filed: Feb. 13, 2019

(65) Prior Publication Data
US 2019/0179139 A1    Jun. 13, 2019

Related U.S. Application Data

(62) Division of application No. 14/455,863, filed on Aug. 8, 2014, now Pat. No. 10,241,325.

(30) Foreign Application Priority Data

Mar. 27, 2014    (KR) .......................... 10-2014-0036220

(51) Int. Cl.
*G02B 27/00* (2006.01)
*H01L 27/32* (2006.01)
(Continued)

(52) U.S. Cl.
CPC ........ *G02B 27/0006* (2013.01); *B29C 41/003* (2013.01); *B29C 45/0003* (2013.01); *B29C 45/14778* (2013.01); *B29C 65/00* (2013.01); *B32B 7/12* (2013.01); *B32B 27/08* (2013.01); *B32B 27/308* (2013.01); *B32B 27/325* (2013.01); *B32B 27/36* (2013.01);
(Continued)

(58) Field of Classification Search
CPC ...... G02B 1/14; G02B 5/3025; G02B 5/3033; G02B 27/0006; B29C 41/003; B29C 43/003; B29C 45/561; B29C 65/00; B32B 7/12; B32B 38/1866
USPC ........................................ 359/487.01, 487.02
See application file for complete search history.

(56) References Cited

U.S. PATENT DOCUMENTS 2,370,697 A    3/1945  Tillyer
3,097,106 A    7/1963  Blout et al.
(Continued)

FOREIGN PATENT DOCUMENTS

CN    1565036 A    1/2005
CN    101754617 A    6/2010
(Continued)

*Primary Examiner* — Ricky D Shafer
(74) *Attorney, Agent, or Firm* — Lewis Roca Rothgerber Christie LLP

(57) ABSTRACT

A display device including: a plastic window including a light transmittance film and a polymer layer, and a functional film including a touch screen panel film, a polarizing film, or a combination thereof. The light transmittance film, the polymer layer, and the functional film are sequentially stacked on each other, and the light transmittance film, the functional film, and the polymer layer are attached to each other by a plastic. A method of manufacturing the same is also provided.

5 Claims, 7 Drawing Sheets

(51) Int. Cl.
- *B29C 45/14* (2006.01)
- *B32B 7/12* (2006.01)
- *B32B 27/08* (2006.01)
- *B32B 27/30* (2006.01)
- *B32B 27/32* (2006.01)
- *B32B 27/36* (2006.01)
- *B29C 41/00* (2006.01)
- *B29C 45/00* (2006.01)
- *B29C 65/00* (2006.01)
- *G06F 3/041* (2006.01)
- *G02B 1/14* (2015.01)
- *B29K 67/00* (2006.01)
- *B29K 69/00* (2006.01)
- *G02B 1/04* (2006.01)
- *G02B 5/30* (2006.01)

(52) U.S. Cl.
CPC .......... *B32B 27/365* (2013.01); *G06F 3/0412* (2013.01); *H01L 27/32* (2013.01); *B29C 2045/14532* (2013.01); *B29K 2067/003* (2013.01); *B29K 2069/00* (2013.01); *B29K 2995/0018* (2013.01); *B32B 2255/10* (2013.01); *B32B 2255/26* (2013.01); *B32B 2270/00* (2013.01); *B32B 2307/42* (2013.01); *B32B 2457/20* (2013.01); *B32B 2457/202* (2013.01); *G02B 1/04* (2013.01); *G02B 1/14* (2015.01); *G02B 5/3033* (2013.01); *G06F 2203/04103* (2013.01)

(56) References Cited

U.S. PATENT DOCUMENTS

| | | |
|---|---|---|
| 3,588,216 A | 6/1971 | Bloom |
| 3,620,888 A | 11/1971 | Buzzell |
| 3,711,417 A | 1/1973 | Schuler |
| 3,940,304 A | 2/1976 | Schuler |
| 6,147,738 A | 11/2000 | Okamoto |
| 7,570,335 B2 | 8/2009 | Kim et al. |
| 7,773,174 B2 | 8/2010 | Shimodaira et al. |
| 10,241,325 B2 * | 3/2019 | Oh .............. G02B 27/0006 |
| 2004/0080824 A1 | 4/2004 | Phillips et al. |
| 2004/0265602 A1 | 12/2004 | Kobayashi et al. |
| 2008/0020209 A1 | 1/2008 | Chen |
| 2010/0238383 A1 | 9/2010 | Nakano et al. |
| 2013/0120838 A1 | 5/2013 | Kim et al. |
| 2013/0135831 A1 * | 5/2013 | Hsu ............ B29C 45/14467 361/752 |
| 2013/0194281 A1 | 8/2013 | Chen et al. |
| 2014/0347824 A1 * | 11/2014 | Cheo ............ B29D 11/0073 361/748 |
| 2015/0000823 A1 * | 1/2015 | Kim ............ B32B 43/006 156/80 |
| 2015/0131035 A1 | 5/2015 | Chen |
| 2015/0240038 A1 * | 8/2015 | Macedo Fechine .. C01B 32/194 428/408 |

FOREIGN PATENT DOCUMENTS

| | | |
|---|---|---|
| KR | 10-2007-0007053 A | 1/2007 |
| KR | 10-0805659 B1 | 2/2008 |
| KR | 10-2009-0010012 A | 1/2009 |
| KR | 10-2010-0035768 A | 4/2010 |
| KR | 10-2014-0034017 | 3/2014 |
| TW | 201322093 A1 | 6/2013 |

* cited by examiner

【FIG. 1】
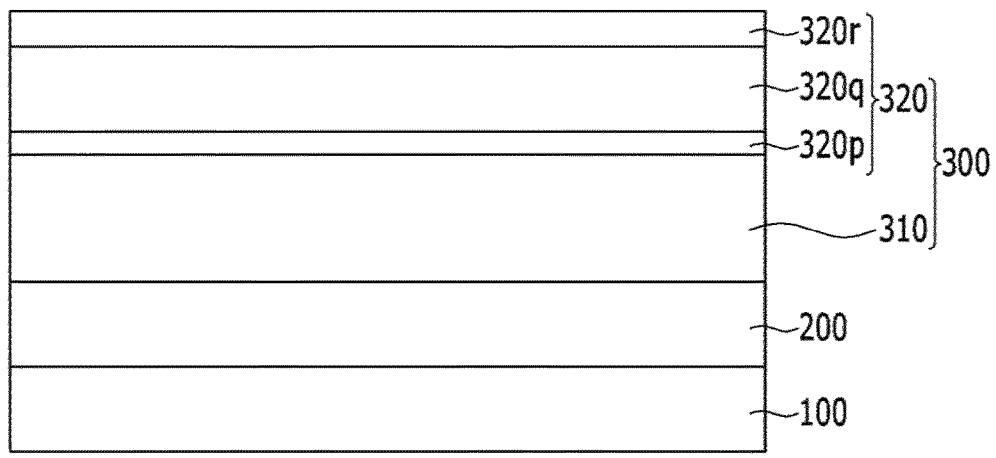
【FIG. 2】
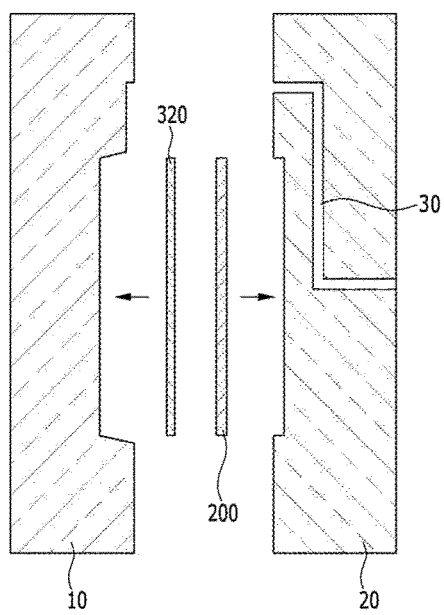

[FIG. 3]
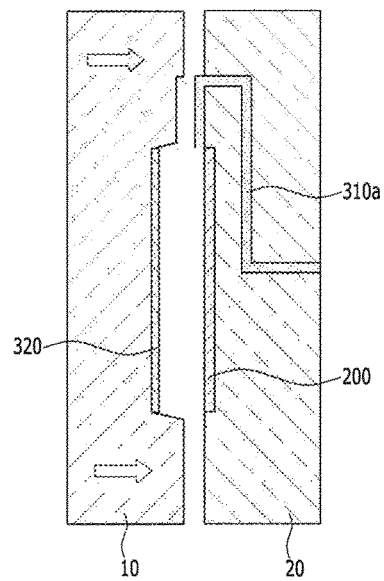
[FIG. 4]
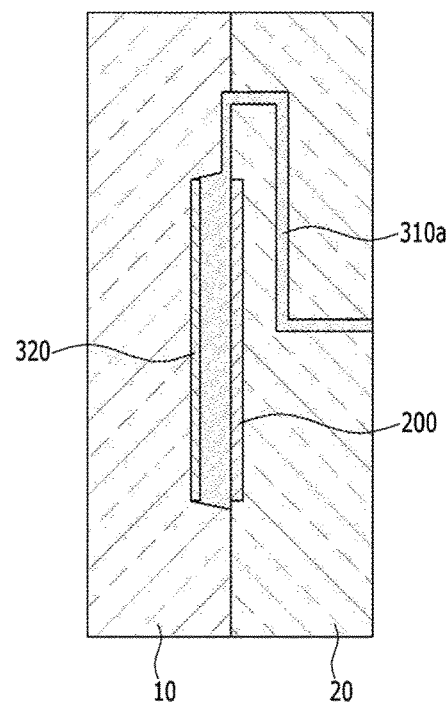

[FIG. 5]
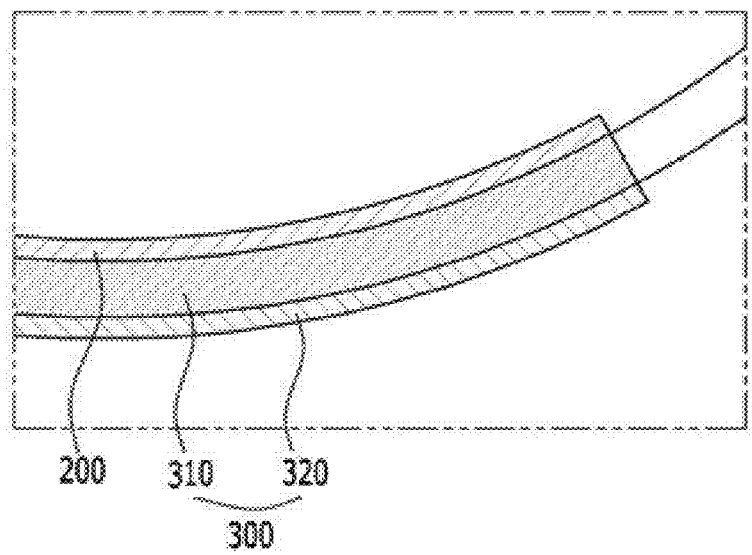
[FIG. 6]
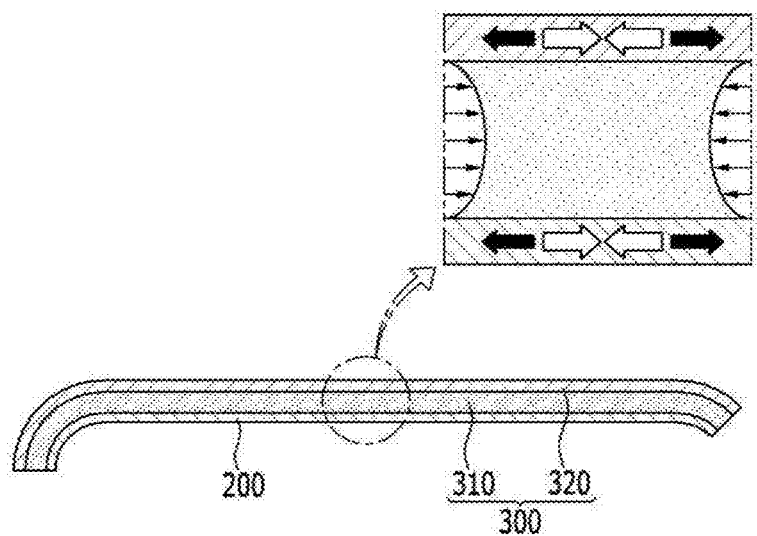

[FIG. 7]
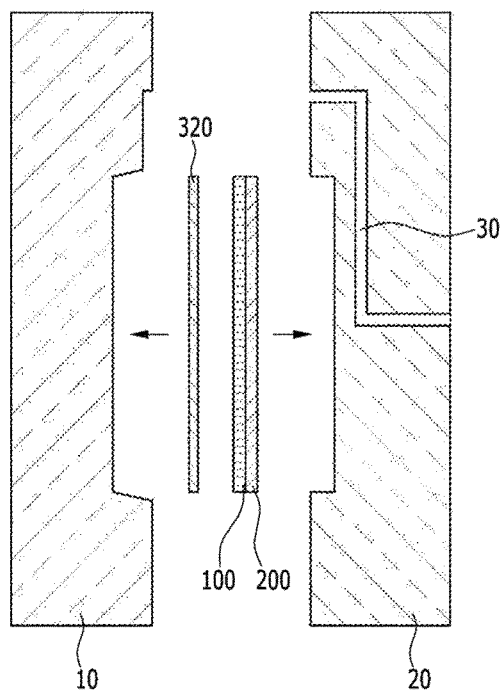
[FIG. 8]
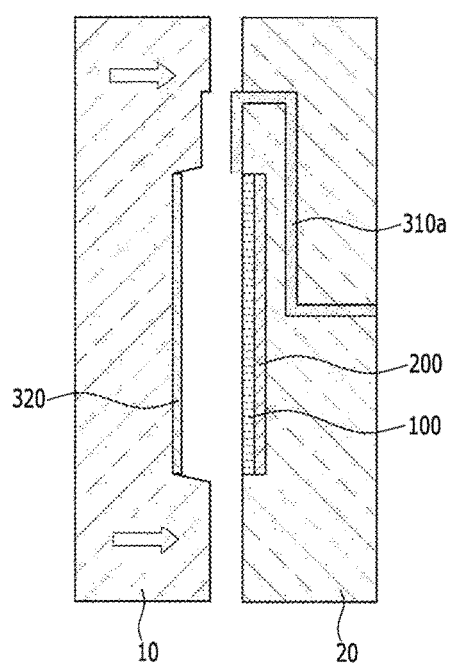

[FIG. 9]
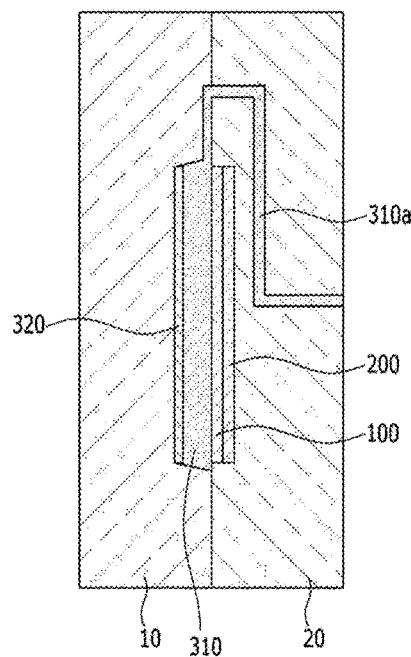
[FIG. 10]
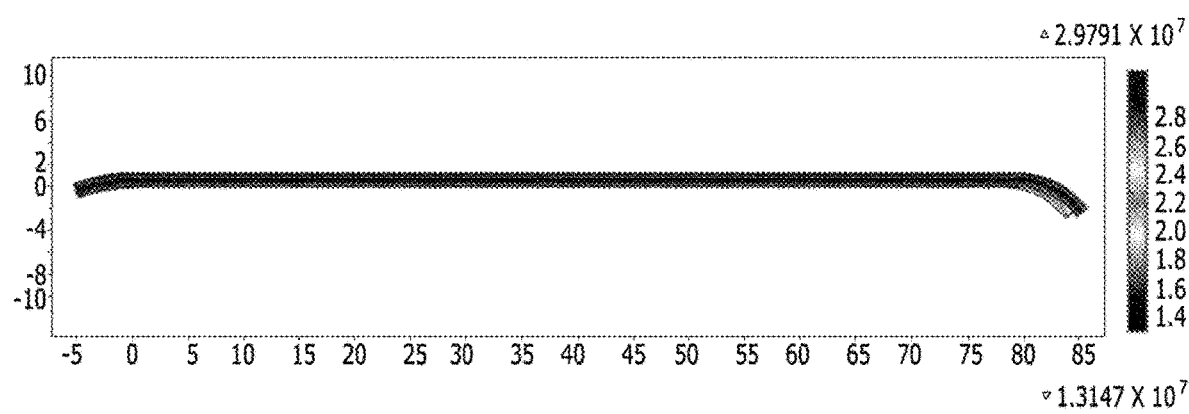

[FIG. 11]
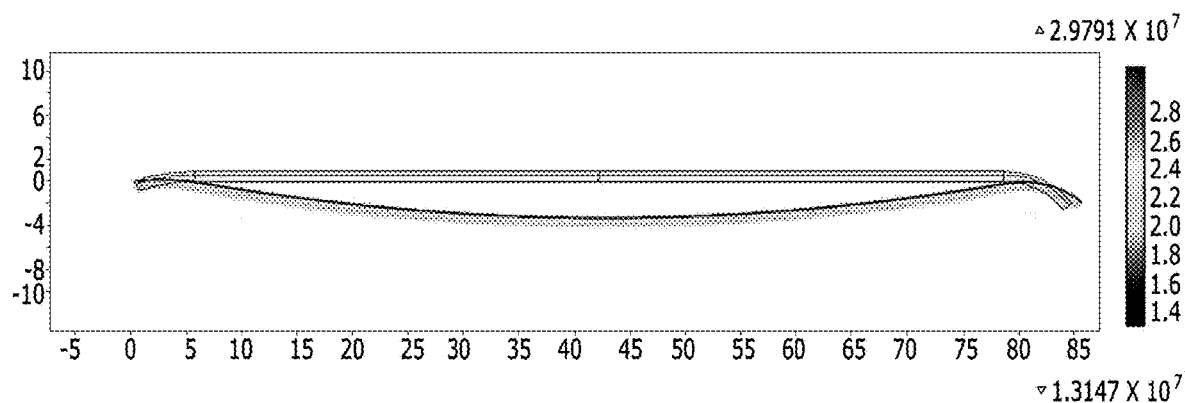
[FIG. 12]
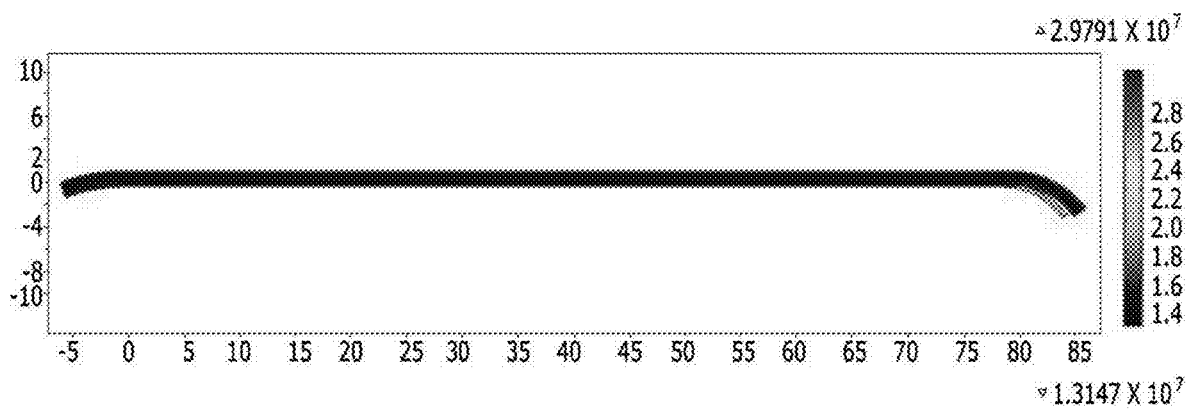
[FIG. 13]
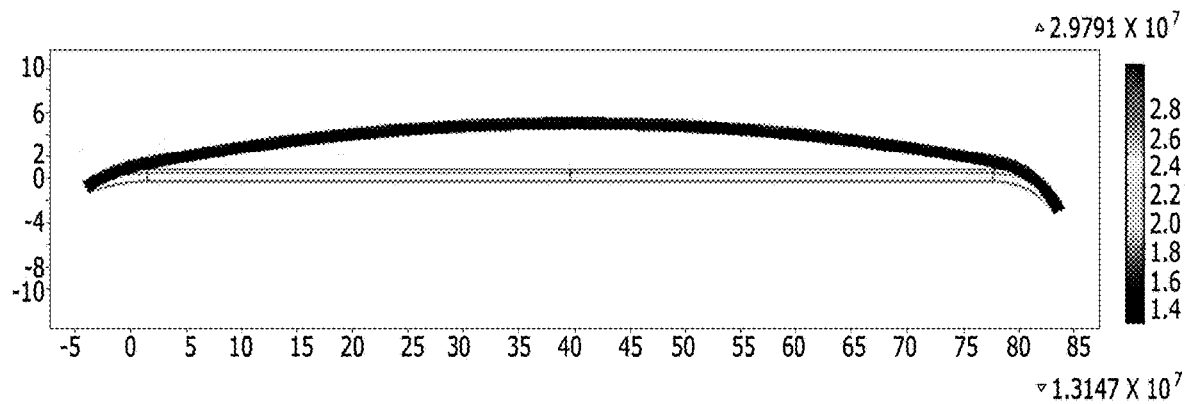

[FIG. 14]
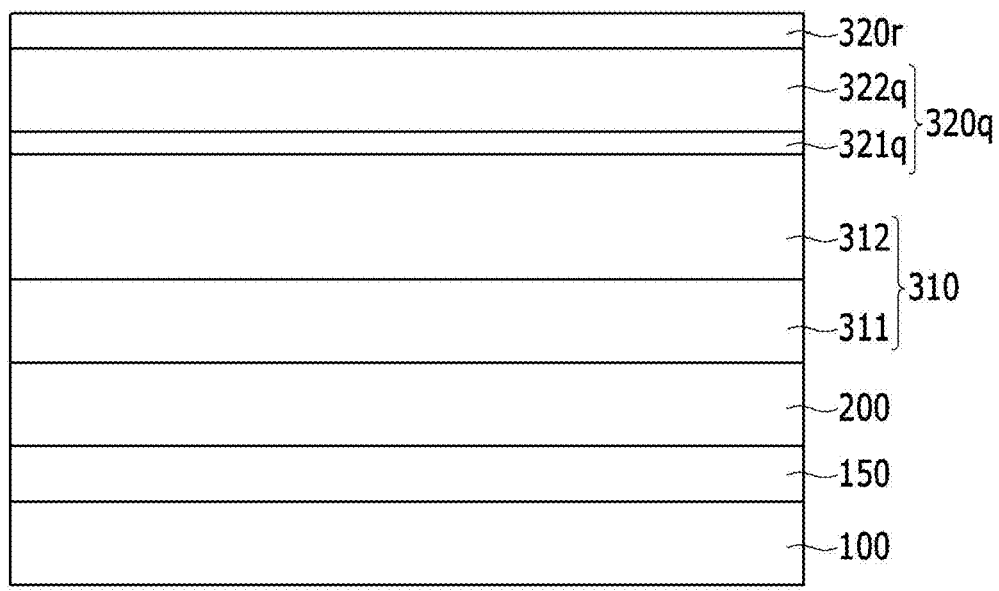

DISPLAY DEVICE AND METHOD OF MANUFACTURING THE SAME

CROSS-REFERENCE TO RELATED APPLICATION

This application is a divisional of U.S. patent application Ser. No. 14/455,863, filed Aug. 8, 2014, which claims priority to and the benefit of Korean Patent Application No. 10-2014-0036220, filed Mar. 27, 2014, the entire content of both of which is incorporated herein by reference.

BACKGROUND

1. Field

Aspects of embodiments of the present invention are directed toward a display device and a method of manufacturing the same.

2. Description of the Related Art

Currently known display devices include, for example, a liquid crystal display (LCD), a plasma display panel (PDP), an organic light emitting diode (OLED) display, a field effect display (FED), an electrophoretic display device, and the like.

Such display devices generally include a display module for displaying an image and a window protecting the display module.

The window may be made of glass. However, because the glass may be easily broken by an external impact, a window made of glass may be easily damaged when applied to a portable device, such as a mobile phone. Therefore, a window made of a plastic instead of glass has been recently researched. The plastic window has excellent flexibility and, thus, may be applied to a flexible display device.

The plastic window may be assembled by using an adhesive layer applied to a panel, such as a display panel, a touch screen panel, and/or a polarizing plate. However, the adhesive layer increases a thickness of a display device and prolongs a manufacturing time due to an adhesion process. In addition, the plastic window may be bent during the manufacturing process and may have unsatisfactory effects on a shape and reliability of the display device.

SUMMARY

An embodiment of the present invention provides a display device including a plastic window.

Another embodiment provides a method of manufacturing the display device.

According to one embodiment, a display device includes a plastic window including a light transmittance film and a polymer layer and a functional film including a touch screen panel film, a polarizing film, or a combination thereof. The light transmittance film, the polymer layer, and the functional film are sequentially stacked on each other and are attached to one another by a plastic.

The light transmittance film and the polymer layer may be bonded to each other without an adhesive therebetween, and the functional film and the polymer layer may be bonded to each other without an adhesive therebetween.

The display device may be manufactured by inserting the light transmittance film and the functional film in a film insert manner and then injecting a molten polymer between the light transmittance film and the functional film and compressing the light transmittance film and the functional film.

The light transmittance film may include a plastic substrate selected from among a polyethyleneterephthalate (PET) film, a polycarbonate (PC) film, a polymethylmethacrylate (PMMA) film, a polycarbonate/polymethylmethacrylate (PC/PMMA) film, a combination thereof, or a two or more layer stack thereof.

The light transmittance film may further include a binder layer between the plastic substrate and the polymer layer.

The light transmittance film may include a hard coating layer at a side of the plastic substrate.

The polymer layer may include polycarbonate (PC), a polycarbonate-polymethylmethacrylate (PC-PMMA) blend, a cycloolefin polymer (COP), a copolymer thereof, a combination thereof, or a two or more layer stack thereof.

The display device may further include a display panel at a side of the functional film.

The display panel may be a liquid crystal display panel or an organic light emitting display panel.

The display device may further include an adhesive layer between the functional film and the display panel.

According to another embodiment, a method of manufacturing a display device includes preparing a light transmittance film, preparing a functional film including a touch screen panel film, a polarizing film, or a combination thereof, placing the light transmittance film and the functional film in a mold, injecting a molten polymer between the light transmittance film, and compressing the light transmittance film and the functional film to mold the polymer.

The preparing the light transmittance film may include forming a hard coating layer on one surface of a plastic substrate.

The plastic substrate may be selected from among a polyethyleneterephthalate (PET) film, a polycarbonate (PC) film, a polymethylmethacrylate (PMMA) film, a polycarbonate/polymethylmethacrylate (PC/PMMA) film, a combination thereof, or a two or more layer stack thereof.

The preparing the functional film may include preparing a touch screen panel film, a polarizing film, or a combination thereof, and attaching a display panel on one side of the touch screen panel film, the polarizing film, or the combination thereof.

The polymer may have a melt flow index (MFR) in a range of about 30 g/10 min to about 80 g/10 min with a reference to about 300° C.

The polymer may include polycarbonate (PC), a polycarbonate-polymethylmethacrylate (PC-PMMA) blend, a cycloolefin polymer (COP), a copolymer thereof, or a combination thereof.

The plastic window-functional film assembly obtained in a dual-film insert manner may be closely attached to (e.g., closely adhered to) each other without a separate adhesive layer and, thus, may reduce or prevent a thickness increase due to the adhesive layer and may be manufactured using a simple process by omitting the adhesive layer (e.g., by omitting attachment of the adhesive layer). In addition, the plastic window may be prevented from being bent (e.g., permanently bent or curved) because the plastic window-functional film assembly prevents an asymmetric stress from being distributed in a thickness direction and maintains a symmetric stress when the molten polymer is quickly (e.g., sharply) cooled down by disposing the light transmittance film and the functional film on opposite sides of the molten polymer during the injection molding. Accordingly, the display device may be prevented from being bent and, thus, may increase reliability of a product.

BRIEF DESCRIPTION OF THE DRAWINGS

FIG. 1 is a cross-sectional view showing a display device according to one embodiment, FIGS. 2 to 4 are schematic views sequentially showing a method of manufacturing the display device according to one embodiment, FIG. 5 is a schematic view showing a plastic window-functional film assembly obtained in a dual-film insert manner according to one embodiment, FIG. 6 is a schematic view showing symmetric stress distribution of the plastic window-functional film assembly obtained in the dual-film insert manner according to one embodiment, FIGS. 7 to 9 are schematic views sequentially showing a method of manufacturing the display device according to another embodiment, FIG. 10 is a graph showing high temperature reliability evaluation of the plastic window-functional film assembly obtained in the dual-film insert manner according to the embodiment, FIG. 11 is a graph showing high temperature reliability evaluation of a plastic window obtained in a comparative (e.g., general) film insert manner, FIG. 12 is a graph showing high temperature/humidity reliability evaluation of the plastic window-functional film assembly obtained in the dual-film insert manner according to the embodiment, FIG. 13 is a graph showing high temperature/humidity reliability evaluation of the plastic window obtained in the comparative film insert manner, and FIG. 14 is a cross-sectional view showing a display device according to one embodiment.

DETAILED DESCRIPTION

This disclosure will be described more fully hereinafter in the following detailed description, in which some but not all embodiments of this disclosure are described. This disclosure may be embodied in many different forms and is not construed as limited to the example embodiments set forth herein.

In the drawings, the thickness of layers, films, panels, regions, etc., may be exaggerated for clarity. Like reference numerals designate like elements throughout the specification. It will be understood that when an element, such as a layer, film, region, or substrate, is referred to as being "on" another element, it can be directly on the other element or intervening elements may also be present. When an element is referred to as being "directly on" another element, there are no intervening elements present. Further, when a first element is being described as "coupled" or "connected" to a second element, the first element may be directly coupled or connected to the second element or may be indirectly coupled or connected to the second element via one or more intervening elements. Even further, the use of "may" when referring to embodiments of the present invention relates to "one or more embodiments of the present invention."

Hereinafter, a display device according to one embodiment is illustrated with reference to FIG. 1.

FIG. 1 is a cross-sectional view showing a display device according to one embodiment.

The display device according to one embodiment includes a plastic window 300, a functional film 200, and a display panel 100.

The plastic window 300 includes a light transmittance film 320 and a polymer layer 310.

The light transmittance film 320 includes a plastic substrate 320$q$, a binder layer 320$p$, and a hard coating layer 320$r$.

The plastic substrate 320$q$ may be a substrate used for a film insert forming process and may be, for example, a polyethyleneterephthalate (PET) film, a polycarbonate (PC) film, a polymethylmethacrylate (PMMA) film, a polycarbonate/polymethylmethacrylate (PC/PMMA) film, a combination thereof, or a greater than or equal to a two-layer stack thereof (see FIG. 14, in which the layers are indicated by 321$q$ and 322$q$). The plastic substrate 320$q$ may be, for example, about 50 μm to about 100 μm thick.

The binder layer 320$p$ may reinforce (e.g., increase) a binding force between the polymer layer 310 and the plastic substrate 320$q$ and include, for example, an acryl-based binder. The binder layer 320$p$ may be, for example, about 5 μm to 10 μm thick. The binder layer 320$p$ may be omitted.

The hard coating layer 320$r$ may be positioned on the surface of the plastic window 300 (e.g., on the surface of the plastic window 300 away from the display panel 100) and may further improve surface hardness of the plastic window 300. The hard coating layer 320$r$ may include, for example, an organic material, an inorganic material, or an organic/inorganic composite compound. In one embodiment, the organic material may include, for example, an acryl-based compound, an epoxy-based compound, or a combination thereof, the inorganic material may include, for example, silica, alumina, or a combination thereof, and the organic/inorganic composite compound may include, for example, polysilsesquioxane, but these materials and compounds not limited thereto. The hard coating layer 320$r$ may be a monolayer or multi-layer and, for example, about 50 μm to about 150 μm thick. The hard coating layer 320$r$ may be omitted.

The polymer layer 310 may be formed of an injection-moldable polymer. The injection moldable polymer may be, for example, selected from resins having a melt flow index (MFR) of greater than or equal to about 30 g/10 min (with a reference to 300° C.), for example, about 30 g/10 min to about 80 g/10 min (with a reference to 300° C.). The polymer layer 310 may include, for example, polycarbonate (PC), a polycarbonate-polymethylmethacrylate (PC-PMMA) blend, a cycloolefin polymer (COP), a copolymer thereof, a combination thereof, or greater than or equal to a two-layer stack thereof (see FIG. 14, in which the layers are indicated by 311 and 312), but is not limited thereto.

The plastic window 300 may be less than or equal to about 1 mm thick.

The functional film 200 may include a touch screen panel (TSP) film, a polarizing film, or a combination thereof. The touch screen panel film may include, for example, a transparent electrode on a substrate, and the polarizing film may have, for example, a structure of stacking a protective layer, such as triacetyl cellulose (TAC), and a polarizer, such as polyvinylacetate (PVA).

The plastic window 300 and the functional film 200 may be adhered to each other without an adhesive layer. For example, the light transmittance film 320 and the polymer layer 310 and also the functional film 200 and the polymer layer 310 are injection-molded and adhered to each other without an adhesive layer interposed therebetween.

The plastic window 300-functional film 200 assembly may be obtained by respectively inserting the light transmittance film 320 and the functional film 200 into a mold in a dual-film insert manner, filling a molten polymer between the light transmittance film 320 and the functional film 200, and compressing them without an additional adhesion process.

The plastic window 300-functional film 200 assembly obtained in a dual-film insert manner forms a closely adhered bond therebetween without a separate adhesive layer and, thus, may prevent a thickness increase due to an adhesive layer and may simplify a manufacturing process due to omission of an adhesion process. In addition, the plastic window 300 may be prevented from being bent (e.g., permanently bent or curved) by disposing the light transmittance film 320 and the functional film 200 on both sides of the molten polymer during the injection molding and, thus, reducing or preventing distribution of asymmetric stress in a thickness direction and maintaining symmetric stress when the molten polymer is sharply cooled down during the injection molding. Accordingly, a display device may be prevented from being bent and reliability of a product may be increased.

The display panel 100 is positioned on one side of the plastic window 300-functional film 200 assembly. The display panel 100 may be, for example, a liquid crystal display panel or an organic light emitting display panel.

The liquid crystal display panel may include first and second panels facing each other and a liquid crystal layer therebetween.

The first panel may include, for example, a thin film transistor on a substrate and a first electric field-generating electrode coupled (e.g., connected) thereto, and the second panel may include, for example, a color filter and a second electric field-generating electrode on a substrate. However, the present invention is not limited thereto, and the color filter may be included in the first panel and/or the first and second electric field-generating electrodes may be positioned together in the first panel.

The liquid crystal layer may include a plurality of liquid crystal molecules. The liquid crystal molecules may have positive or negative dielectric anisotropy. When the liquid crystal molecules have positive dielectric anisotropy, their long axes are almost parallel (e.g., are substantially parallel) to the surface of the first and second panels in a state of no electric field (e.g., when no electric field is applied thereto). When an electric field is applied thereto, the liquid crystal molecules are almost perpendicularly arranged (e.g., are substantially perpendicular) with respect to the surface of the first and second display panels. When the liquid crystal molecules have negative dielectric anisotropy, their long axes are almost perpendicular (e.g., are substantially perpendicular) to the surface of the first and second panels in a state of no electric field. When an electric field is applied thereto, the liquid crystal molecules are arranged almost parallel (e.g., are substantially parallel) to the surface of the first and second panels.

The organic light emitting panel may include a base substrate, a lower electrode, an organic emission layer, an upper electrode, and an encapsulation substrate.

The base substrate may be made of glass or plastic.

One of a lower electrode and an upper electrode may be an anode and the other one may be a cathode. The anode is an electrode into which holes are injected and may be made of a transparent and conductive material having a high work function and allow light to be emitted therethrough, for example, indium tin oxide (ITO) or indium zinc oxide (IZO).

The cathode is an electrode into which electrons are injected and may be made of a conductive material having a low work function and having no influence on an organic material, for example, aluminum (Al), calcium (Ca), or barium (Ba).

The organic emission layer includes an organic material that emits light when a voltage is applied to the lower and upper electrodes.

An auxiliary layer may be further included between the lower electrode and the organic emission layer and between the upper electrode and the organic emission layer. The auxiliary layer may include a hole transporting layer (HTL) to balance electrons and holes, a hole injection layer (HIL), an electron injection layer (EIL), and/or an electron transporting layer (ETL).

The encapsulation substrate may be made of glass, a metal, or a polymer and, thus, seals the lower electrode, organic emission layer, and upper electrode to prevent moisture and/or oxygen from flowing therein.

The functional film 200 and the display panel 100 may be adhered by interposing an adhesive layer 150 therebetween. The adhesive layer 150 may include, for example, an optically clear adhesive (OCA).

Hereinafter, a method of manufacturing the display device is illustrated with a reference to FIGS. 2 to 4.

FIGS. 2 to 4 are schematic views sequentially showing the method of manufacturing the display device according to one embodiment.

First, a light transmittance film 320 and a functional film 200 are respectively prepared.

The light transmittance film 320 may be prepared by forming a binder layer 320p on one surface of a plastic substrate 320q and a hard coating layer 320r on the other surface thereof. However, at least one of the binder layer 320p or the hard coating layer 320r may be omitted.

The plastic substrate 320q may be selected from, for example, a polyethyleneterephthalate (PET) film, a polycarbonate (PC) film, a polymethylmethacrylate (PMMA) film, a polycarbonate/polymethylmethacrylate (PC/PMMA) film, or a combination thereof, the binder layer 320p may include, for example, an acryl-based binder, and the hard coating layer 320r may include, for example, an organic material, an inorganic material, or an organic/inorganic composite compound.

The functional film 200 may be a touch screen panel film, a polarizing film, or a combination thereof. The touch screen panel film may be prepared by selectively forming a hard coating layer on a substrate, such as a PET substrate, and then forming a transparent electrode pattern, such as ITO, thereon. The polarizing film may be prepared by forming a protective layer, such as TAC, on one side or both sides of a polarizer, such as PVA, but is not limited thereto.

Subsequently, referring to FIG. 2, molds having a predetermined cavity 10 and 20 are prepared, and the light transmittance film 320 and the functional film 200 are disposed (e.g., disposed at a predetermined distance) between the molds 10 and 20. For example, the molds 10 and 20 may have a plane-shaped groove, and the groove may have enough area (e.g., the groove may have sufficient width and/or depth) that the light transmittance film 320 and the functional film 200 may be inserted thereinto. One (e.g., either one) of the molds 10 and 20 has an inlet 30 through which a molten polymer is inserted (e.g., injected), and the molten polymer may be supplied through the inlet 30.

Subsequently, referring to FIG. 3, the molds 10 and 20 are moved to be closer together to perform compression molding for thin injection molding.

Subsequently, referring to FIG. 4, the molten polymer 310a is supplied through the inlet 30 of the mold 10 and/or 20 and charged (e.g., injected) between the light transmittance film 320 and the functional film 200. The molten polymer 310a may be, for example, selected from resins having a melt flow index (MFR) of greater than or equal to about 30 g/10 min (with a reference to 300° C.), for example, about 30 g/10 min to about 80 g/10 min (with a reference to 300° C.). The molten polymer 310a may include, for example, polycarbonate (PC), a polycarbonate-polymethylmethacrylate (PC-PMMA) blend, a cycloolefin polymer (COP), a copolymer thereof, or a combination thereof, but is not limited thereto.

Subsequently, the molten polymer 310a is compressed and sharply cooled down to form a polymer layer 310.

FIG. 5 is a schematic view showing a plastic window-functional film assembly obtained in a dual-film insert manner according to one embodiment.

In this embodiment, a plastic window 300-functional film 200 assembly obtained by sequentially stacking the light transmittance film 320, the polymer layer 310, and the functional film 200 in a dual-film insert manner may be closely attached (e.g., closely adhered) without an adhesive layer.

FIG. 6 is a schematic view showing symmetric stress distribution of the plastic window-functional film assembly obtained in the dual-film insert manner according to one embodiment.

Referring to FIG. 6, a plastic window obtained in a comparative (e.g., general) film insert manner is bent (e.g., curved) toward one direction due to asymmetric stress distribution when a molten polymer is sharply cooled down, while the plastic window-functional film assembly obtained in the dual-film insert manner according to the embodiment symmetrically supports the light transmittance film 320 and the functional film 200, maintains symmetric stress in a thickness direction, and may be prevented from being bent (e.g., permanently bent or curved) even though the molten polymer is sharply cooled down. Accordingly, the prevention of the plastic window from being bent is improved and, thus, may increase reliability of a product.

Referring to FIGS. 10 to 13, high temperature reliability and high temperature/humidity reliability evaluations of the plastic window-functional film assembly obtained in the dual-film insert manner are illustrated.

In FIGS. 10 to 13, the plastic window-functional film assembly obtained in the dual-film insert manner according to the embodiment includes a touch screen panel as a functional film.

FIG. 10 is a graph showing high temperature reliability evaluation of the plastic window-functional film assembly obtained in the dual-film insert manner according to the embodiment, and FIG. 11 is a graph showing high temperature reliability evaluation of the plastic window obtained in a comparative film insert manner.

Referring to FIGS. 10 and 11, the plastic window-functional film assembly obtained in the dual-film insert manner according to the embodiment is almost entirely straight (e.g., not bent or curved) when allowed to stand at 85° C. (see FIG. 10), while the plastic window obtained in the comparative film insert manner is largely bent or curved when allowed to stand at 85° C. (see FIG. 11).

FIG. 12 is a graph showing high temperature/humidity reliability evaluation of the plastic window-functional film assembly obtained in the dual-film insert manner according to the embodiment, while FIG. 13 is a graph showing high temperature/humidity reliability evaluation of the plastic window obtained in the comparative film insert manner.

Referring to FIGS. 12 and 13, the plastic window-functional film assembly obtained in the dual-film insert manner according to the embodiment is almost entirely straight (e.g., not bent or curved) at a 85° C. temperature/85% humidity evaluation (see FIG. 12), while the plastic window obtained in the comparative film insert manner is largely bent at a 85° C. temperature/85% humidity evaluation (see FIG. 13).

The plastic window-functional film assembly is assembled with a display panel and manufactured into a display device.

Hereinafter, a method of manufacturing the display device according to another embodiment is illustrated.

FIGS. 7 to 9 are schematic views sequentially showing a method of manufacturing the display device according to another embodiment.

According to the embodiment, a display panel 100 is adhered to a functional film 200 before performing injection molding in a dual-film insert manner, unlike the above embodiment.

First, a light transmittance film 320 and the functional film 200 are respectively prepared.

The light transmittance film 320 may be prepared by forming a binder layer 320p on one surface of a plastic substrate 320q and a hard coating layer 320r on the other surface thereof as described above. However, at least one of the binder layer 320p or the hard coating layer 320r may be omitted.

The functional film 200 may be prepared by preparing a touch screen panel film, a polarizing film, or a combination thereof and attaching the display panel 100 on one side of the touch screen panel film, the polarizing film, or the combination thereof. The attachment of the display panel 100 to the touch screen panel film, the polarizing film, or the combination thereof may be performed by using an adhesive agent.

Referring to FIG. 7, molds 10 and 20 having a predetermined cavity are prepared, and the functional film 200 having the display panel 100 attached thereto and the light transmittance film 320 are disposed at a space (e.g., a predetermined space) inside (e.g., between) the molds 10 and 20. For example, the molds 10 and 20 may have a plane-shaped groove, and the groove may have enough area that the light transmittance film 320 and the functional film 200, to which the display panel 100 is bound, may be inserted therein. At least one of the molds 10 and 20 may have an inlet 30 through which a molten polymer may be inserted, and thus, the molten polymer may be supplied through the inlet 30.

Referring to FIG. 8, the molds 10 and 20 are brought closer together and compressed for thin film injection molding.

Referring to FIG. 9, the molten polymer 310a is supplied through the inlet 30 of the molds 10 and/or 20 to fill the molten polymer 310a between the light transmittance film 320 and the functional film 200 to which the display panel 100 is bound.

Subsequently, the molten polymer 310a is compressed and sharply cooled down to form a polymer layer 310.

While this disclosure has been described in connection with what is presently considered to be practical example embodiments, it is to be understood that the invention is not limited to the disclosed embodiments, but is intended to cover various modifications and equivalent arrangements included within the spirit and scope of the appended claims and their equivalents.

What is claimed is:

1. A method of manufacturing a display device, the method comprising:
   preparing a light transmittance film;
   preparing a functional film comprising a touch screen panel film, a polarizing film, or a combination thereof;
   placing the light transmittance film and the functional film in a mold;
   injecting a molten polymer between the light transmittance film and the functional film; and
   compressing the light transmittance film and the functional film to mold the polymer,
   wherein the polymer has a melt flow index (MFR) in a range of 30 g/10 min to 80 g/10 min with a reference to 300° C.

2. The method of claim 1, wherein the preparing the light transmittance film comprises forming a hard coating layer on one surface of a plastic substrate.

3. The method of claim 2, wherein the plastic substrate is selected from among a polyethyleneterephthalate (PET) film, a polycarbonate (PC) film, a polymethylmethacrylate (PMMA) film, a polycarbonate/polymethylmethacrylate (PC/PMMA) film, a combination thereof, or a two or more layer stack thereof.

4. The method of claim 1, wherein the preparing the functional film comprises:
   preparing a touch screen panel film, a polarizing film, or a combination thereof; and
   attaching a display panel on one surface of the touch screen panel film, the polarizing film, or the combination thereof.

5. The method of claim 1, wherein the polymer comprises polycarbonate (PC), a polycarbonate-polymethylmethacrylate (PC-PMMA) blend, a cycloolefin polymer (COP), a copolymer thereof, or a combination thereof.

* * * * *